United States Patent [19]

Kwan et al.

[11] Patent Number: 5,600,287
[45] Date of Patent: Feb. 4, 1997

[54] ACOUSTIC WAVE FILTER WITH REDUCED BULK-WAVE SCATTERING LOSS, LADDER FILTER INCORPORATING SAME AND METHOD

[75] Inventors: Philip P. Kwan, Tempe; Thomas S. Hickernell, Mesa; David Penunuri, Fountain Hills, all of Ariz.

[73] Assignee: Motorola, Inc., Schaumburg, Ill.

[21] Appl. No.: 451,827

[22] Filed: May 26, 1995

Related U.S. Application Data

[63] Continuation-in-part of Ser. No. 251,159, May 31, 1994, Pat. No. 5,434,466, and Ser. No. 191,232, Feb. 3, 1994, Pat. No. 5,471,178.

[51] Int. Cl.[6] ..................................................... H03H 9/64
[52] U.S. Cl. .................. 333/195; 310/313 B; 310/313 D
[58] Field of Search .................................... 333/193–196; 310/313 R, 313 B, 313 C, 313 D

[56] References Cited

U.S. PATENT DOCUMENTS

| | | | |
|---|---|---|---|
| 3,886,505 | 5/1975 | Hartman et al. | 333/72 |
| 4,065,735 | 12/1977 | Palfreeman et al. | 333/72 |
| 4,072,915 | 2/1978 | Mitchell | 333/72 |
| 4,166,258 | 8/1979 | Tseng | 333/195 |
| 4,237,433 | 12/1980 | Tanski | 333/195 |
| 4,255,726 | 3/1981 | Kinoshita et al. | 333/195 |
| 4,303,897 | 12/1981 | Augst | 333/189 |
| 4,340,834 | 7/1982 | Sato | 310/335 |
| 4,468,642 | 8/1984 | Hikita | 333/193 |
| 4,577,168 | 3/1986 | Hartmann | 333/170 |
| 4,599,587 | 7/1986 | Hartmann et al. | 333/176 |
| 4,625,208 | 11/1986 | Skeie et al. | 342/51 |
| 4,635,009 | 1/1987 | Ebata | 333/195 |
| 4,642,506 | 2/1987 | Lewis | 310/313 D |
| 4,694,266 | 9/1987 | Wright | 333/196 |
| 4,734,664 | 3/1988 | Hikita et al. | 333/193 |
| 4,742,319 | 5/1988 | Sone | 333/195 |
| 4,760,360 | 7/1988 | Grassl et al. | 333/195 |
| 4,803,449 | 2/1989 | Hikita et al. | 333/193 |
| 4,837,476 | 6/1989 | Mochizuki | 333/195 |
| 4,954,793 | 9/1990 | Misu et al. | 333/133 |
| 4,965,479 | 10/1990 | Elliott et al. | 310/313 D |
| 5,051,644 | 9/1991 | Wright | 310/313 B |
| 5,061,871 | 10/1991 | Wright | 310/313 B |
| 5,115,216 | 5/1992 | Hikita et al. | 333/195 |
| 5,130,597 | 7/1992 | Mariani | 310/313 D |
| 5,274,345 | 12/1993 | Gau | 333/153 |
| 5,351,022 | 9/1994 | Ruile et al. | 333/195 |
| 5,363,073 | 11/1994 | Higgins | 333/195 |
| 5,392,013 | 2/1995 | Yamamoto et al. | 333/195 |
| 5,434,466 | 7/1995 | Hickernell et al. | 333/195 |

FOREIGN PATENT DOCUMENTS

| | | |
|---|---|---|
| 0530547 | 3/1993 | European Pat. Off. . |
| 0545672 | 6/1993 | European Pat. Off. . |

OTHER PUBLICATIONS

"A Fast Green's Function Method For Calculating Bulk Wave Frequency Responses From Saw Frequency Responses", by K. C. Wagner and O. Manner, from Siemens AG, Central Research Laboratories, Munich, Germany, Siemens AG Austria, ETG 323, Vienna, Austria 1990 IEEE.

*Primary Examiner*—Benny Lee
*Assistant Examiner*—Darius Gambino
*Attorney, Agent, or Firm*—Frederick M. Fliegel

[57] ABSTRACT

A method and apparatus for an acoustic wave filter (110) with reduced bulk-wave scattering loss and a ladder filter (30, 40) incorporating same. The method includes steps of providing an acoustic wave propagating substrate (111) and disposing a first reflector (112) on a first surface thereof. The method also includes disposing a first transducer (115) to a first side of the first reflector (112). The first transducer (115) is separated from the first reflector (112) by a first gap (118) having a first width (114) exceeding one-fourth of the acoustic wavelength. The method also includes disposing a second reflector (112') to a side of the first transducer (115) opposite the first reflector (112). The first (112) and second (112') reflectors each include a group of periodically disposed reflective elements (113, 113'). The second reflector (112') is separated from the first transducer (115) by a second gap (140) having a second width (139). The method also includes disposing a first waveguiding element (116) having a first breadth (117) within the first gap (118).

19 Claims, 5 Drawing Sheets

ACOUSTIC WAVE FILTER WITH REDUCED BULK-WAVE SCATTERING LOSS, LADDER FILTER INCORPORATING SAME AND METHOD

CROSS-REFERENCE TO RELATED APPLICATIONS

This application is a continuation-in-part of U.S. patent application Ser. No. 08/251,159, filed on May 31, 1994, now U.S. Pat. No. 5,434,466 and application Ser. No. 08/191,232, filed on Feb. 3, 1994 now U.S. Pat. No. 5,471,178, which are assigned to the same assignee as the present application.

FIELD OF THE INVENTION

This invention relates in general to the field of radio frequency apparatus, in particular to radio frequency filters and more particularly to radio frequency filters employing acoustic waves. This invention relates in general to surface acoustic wave filters, in particular to leaky surface wave/surface skimming bulk wave filters and more particularly to acoustic filters fabricated with high electromechanical coupling coefficient substrates.

BACKGROUND OF THE INVENTION

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch- and credit-card-sized paging apparatus and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or -equipment information sharing requirements. The desire to render increasingly complicated communications nodes portable and even hand-held and/or -portable and/or pocket-sized places extreme demands on filtering technology in the context of increasingly crowded radio frequency resources.

Acoustic wave filters provide filters meeting stringent performance requirements which are (i) extremely robust, (ii) readily mass produced, (iii) adjustment-free over the life of the unit and which (iv) sharply increase the performance to size ratio achievable in the frequency range extending from a few tens of megahertz to about several gigahertz. However, need for low passband insertion loss simultaneously coupled with demand for high shape factor and high stopband attenuation pose filter design and performance requirements not easily met by a single acoustic wave filter alone.

One approach to satisfying these needs and demands is to cascade two or more acoustic wave filters. This approach realizes increased stopband signal rejection but requires additional matching components (e.g., inductors and/or capacitors) and also multiplies the volume and weight of the acoustic wave filters by the number of such filters cascaded. Matching components additionally incur major size and weight penalties because each transducer generally requires at least two matching components, each of which is at least as large as an acoustic wave filter die.

Another approach is to provide two or more such filters on a single substrate, wherein the filters are designed to have purely real impedances matched one to another without requiring intervening matching components. One realization includes a series-parallel arrangement of resonant elements having staggered center frequencies and arranged in a ladder structure, i.e., a structure comprising cascaded sections each including a series resonant element followed by a shunt resonant element. Typically, within each section, the anti-resonant frequency of the shunt element is chosen to be the resonant frequency of the accompanying series element, providing pure real input and output impedances. Disadvantages of this approach when implemented employing SAW resonators include a fixed bandwidth for the electromechanical coupling coefficient ($k^2$) associated with the chosen substrate material. Prior art ladder filter structures employing piezoelectric series and/or shunt elements have generally been confined to extremely narrow bandwidths, on the order of 0.01% to 0.1%, in part because they have been implemented with piezoelectric materials having very low electromechanical coupling coefficients. Generally, conventional approaches are such that when three of the filter material, impedance, selectivity and bandwidth characteristics are specified, the fourth is also determined.

What is needed is a ladder filter configuration/design methodology providing flexible bandwidth, suitable out-of-band rejection and low in-band insertion loss, not requiring external matching components, drift-free performance and realizable in compact, monolithic form.

Acoustic wave filters employ generally periodic arrays of electrodes configured to provide discrete elements such as transducers (for converting electrical to mechanical energy and vice versa), reflectors (for reversing the direction of propagation of an acoustic wave) and gratings (e.g., for separating transducers and/or resonant cavities and/or providing electrical isolation therebetween). These elements are grouped in a generally in-line configuration (e.g., reflector, transducer, grating, transducer, reflector) and are separated by inter-element gaps, with the entire array providing an electrical filtering function associated with the electrical port(s) of the transducer(s). The relative widths of the inter-element gaps affect the electrical and acoustic performance of the composite filter.

The desired electrical performance often dictates gap sizes representing deviations from the periodicities of the respective elements, providing surface boundary condition discontinuities and reflecting a portion of the incident acoustic wave and scattering another portion into bulk acoustic waves. Particularly on high electromechanical coupling coefficient substrates, surface boundary condition discontinuities lead to bandwidth perturbations, increased in-band (i.e., passband) insertion loss and decreased out-of-band (i.e., stop-band) signal rejection.

What are needed is an apparatus and a method for making acoustic wave filters having electrical performance characteristics that are less degraded by bulk scattering losses even when implemented on high coupling coefficient substrates.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

Generally, the present invention provides a method and apparatus for reducing bulk-acoustic-wave losses and related effects in acoustic wave (e.g., SAW, surface skimming bulk wave, leaky wave etc.) type filters fabricated on high electrical coupling coefficient substrates. This may be accomplished by reducing the number and/or magnitude of surface boundary condition discontinuities contained within the filter structure while preserving geometries that provide the desired transfer function. These effects may be calculated using suitable modeling tools such as Green's function methods as described in "A Fast Green's Function Method For Calculating Bulk Wave Frequency Responses From SAW Frequency Responses" by K. C. Wagner and O. Manner, 1990 IEEE Ultrasonics Symposium Proceedings, pp. 411–415.

Figure 1:
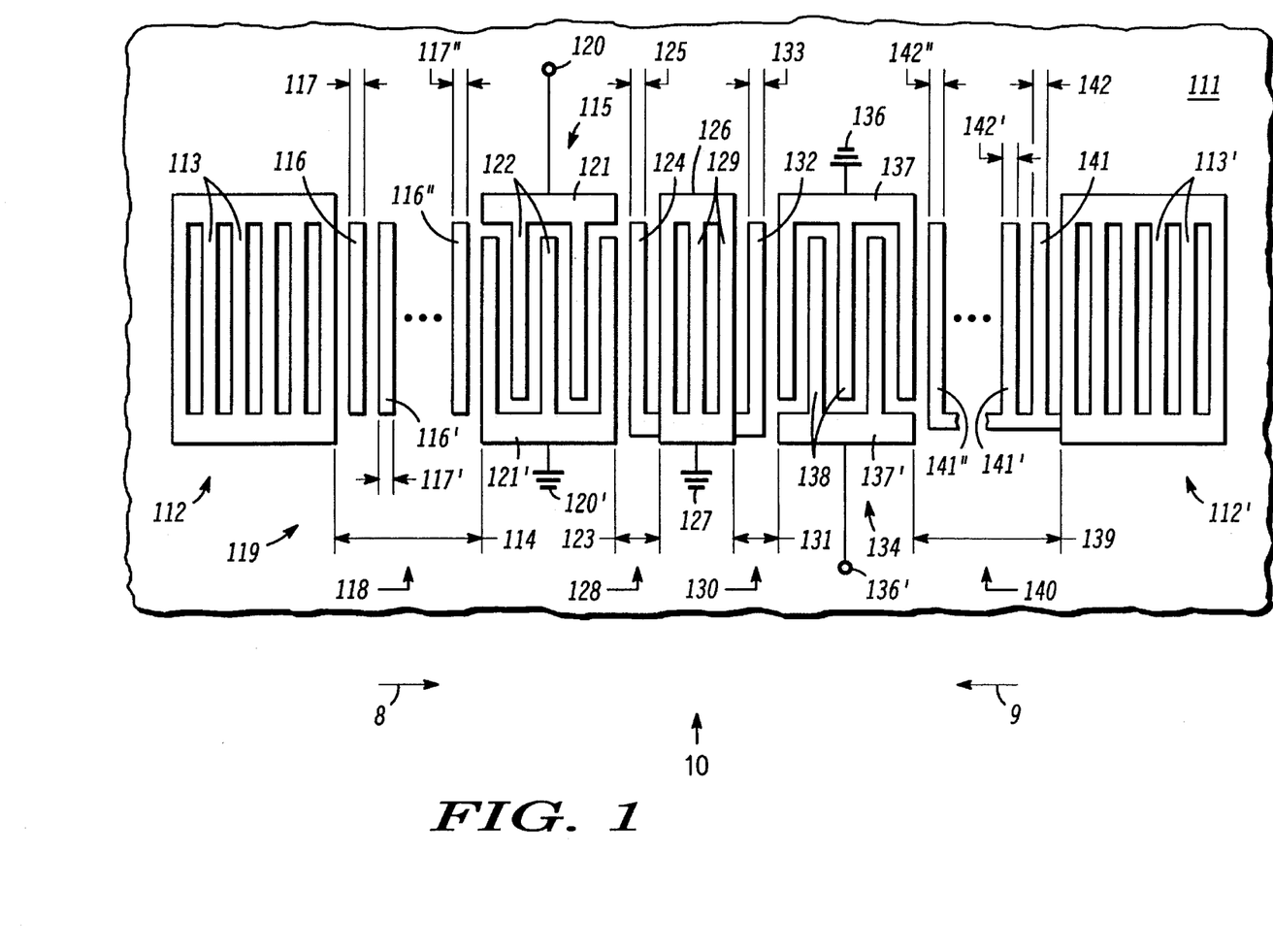
FIG. 1 is a plan view of an acoustic wave filter in accordance with the present invention.

The present invention may be more fully understood with reference to FIG. 1, which provides a simplified plan view of acoustic wave filter 110 in accordance with the present invention. FIG. 1 illustrates acoustic wave filter 110 comprising acoustic wave propagating substrate 111 having filter pattern 119 disposed thereon. Filter pattern 119 usefully comprises reflectors 112, 112', one or more transducers 115, 134 and (optional) grating 126, separated by gaps 118, 128, 130, 140, all collectively disposed along a preferred axis of the substrate material and on a suitably-prepared surface thereof.

Filters of this type typically include at least two reflectors 112, 112', at least one transducer (e.g., 115, 134) disposed between reflectors 112, 112', optional grating 126 (comprising electrodes 129) and gaps 118, 128, 130, 140 separating the transducer(s) 115, 134 from reflectors 112, 112' and optional grating 126. Electrical stimulation at an appropriate frequency supplied via interconnections 120, 120' or 136, 136' to bus bars 121, 121' or 137, 137' and thence to interleaved electrodes 122 or 138 results in acoustic waves being generated within transducer 115 or 134. Similarly, acoustic waves of an appropriate frequency impinging upon electrodes 122 or 138 result in electrical signals being manifested at interconnections 120, 120' or 136, 136'. As used herein, the term "acoustic wavelength" is taken to mean an acoustic wavelength at the filter center frequency, i.e., in the nominal center of the filter passband.

Each transducer 115, 134 comprises a series of periodically disposed electrodes 122, 138, often one-fourth of an acoustic wavelength in width, disposed on one-half acoustic wavelength centers, usually alternately coupled to their associated bus bars 121, 121' or 137, 137', respectively, although other arrangements are possible and useful.

FIG. 1 illustrates gaps 118, 128, 130, 140 having widths 114, 123, 131, 139, respectively, each width usefully greater than one-eighth of the acoustic wavelength, desirably greater than one-fourth of the acoustic wavelength and preferably greater than one-half of the acoustic wavelength. When gaps 118, 128, 130 and/or 140 include a plurality of waveguiding elements (e.g., 116, 116' . . . 116"), gaps 118, 128, 130, 140 having widths 114, 123, 131, 139, respectively, desirably have widths in a range of from one-half to two wavelengths. Gaps 118, 128, 130, 140 optionally include waveguiding elements 116, 116' . . . 116", 124, 132, 141, 141' . . . 141" disposed therein, respectively, and having breadths 117, 117' . . . 117", 125, 133, 142, 142' . . . 142" respectively. Waveguiding elements such as 116, 116' . . . 116", 124, 132, 141, 141' . . . 141" may favorably affect the insertion loss, bandwidth, out-of-band signal rejection, selectivity, bandshape and electrical impedance of filter 110 by reducing scattering and reflections occurring at acoustic surface boundary condition discontinuities such as those associated with gaps 118, 128, 130, 140. Such surface boundary condition discontinuities are particularly pronounced when gaps 118, 128, 130, 140 exceed one-half of the acoustic wavelength in width. Higher electromechanical coupling coefficient materials exacerbate reflections and/or scattering because the boundary condition changes provided by gaps (e.g., gaps 118, 128, 130, 140) are more profound in these materials.

Filters such as that illustrated in FIG. 1 may be constructed on suitably-prepared substrates such as 41° $LiNbO_3$, 64° $LiNbO_3$ and 36° $LiTaO_3$. Filter pattern 119 is typically fabricated by depositing and patterning a thin metal film, often comprising aluminum in a thickness ranging from tens to hundreds of nanometers thick, by techniques similar to those employed in integrated circuit manufacturing.

The present invention is especially useful when low insertion loss is required together with wide passband width, for which higher electromechanical coupling coefficient substrates are particularly well suited. These materials also give rise to increased susceptibility to scattering of acoustic energy into the depth of the substrate, which is especially pronounced for discontinuities in the electrical boundary conditions existing at the substrate surface in the transducer patterns (i.e., at gaps 118, 128, 130, 140), particularly when gaps 118, 128, 130, 140 exceed one-half of the acoustic wavelength in width.

Breadths 117, 117' . . . 117", 125, 133, 142, 142' . . . 142" are usefully in the range of from one-twentieth to one-half of the acoustic wavelength, desirably in the range of from one-tenth to one-fifth of the acoustic wavelength and preferably in the range of from one-eighth to one-sixth (or about 0.15) of the acoustic wavelength. Waveguiding elements 116, 116' . . . 116", 124, 132, 141, 141' . . . 141" are typically aperiodic with reflection elements 113, 113' and transducer electrodes 122, 138 because the widths of waveguiding elements 116, 116' . . . 116", 124, 132, 141, 141' . . . 141" differ from that of either reflection elements 113, 113' and transducer electrodes 122, 138 and further because waveguiding elements 116, 116' . . . 116", 124, 132, 141, 141' . . . 141" do not necessarily maintain the center-to-center separation of either reflection elements 113, 113' or transducer electrodes 122, 138. Inclusion of waveguiding elements 116, 116' . . . 116", 124, 132, 141, 141' . . . 141" within gaps having widths of greater than one-fourth and especially within gaps having widths greater than one-half of the acoustic wavelength decreases scattering of acoustic waves into the bulk of the substrate, reducing passband insertion loss while preserving bandwidth and other desired filter characteristics.

While waveguide elements 141, 141' . . . 141" are illustrated as being electrically coupled to reflector 112', waveguide elements 116, 116' . . . 116", 141, 141' . . . 141" may be electrically decoupled from either reflectors 112, 112', transducers 115, 134 or both (as illustrated for waveguide elements 116, 116' . . . 116") or may be electrically coupled to transducer 115 or 134 (not illustrated) or may be electrically coupled to both a transducer 115 or 134 and a reflector 112 or 112' (not illustrated). Similarly, while waveguide elements 124, 132 are illustrated as being electrically coupled to grating 126, waveguide elements 124 and/or 132 may be coupled to transducer 115 or 134, respectively, or may be electrically decoupled from either transducers 115, 134 and grating 126.

Applicants have discovered that in some applications, viz., those requiring broader bandwidth, advantages accrue from "floating" the waveguiding element(s) as illustrated for waveguide elements 116, 116' . . . 116", i.e., not coupling waveguiding elements 116, 116' . . . 116" and/or 141, 141' . . . 141" to other structures (e.g., transducer(s) 115, 134 or optional grating 126). This typically enhances bandwidth, albeit often with concomitant but moderate increase of in-band ripple. For example, in one design having a nominal center frequency of about 931.5 MHz and employing six series and five shunt resonators fabricated on 36° LiTaO₃ and having the parameters listed in Table I below, The resonator filter described in Table I had a 1 dB passband bandwidth of about 6 MHz, measured for a filter having no waveguiding elements, while a filter including 1 waveguiding elements in each gap showed a 1 dB bandwidth of about 8.4 MHz, i.e., an increase of greater than 30%. This increase substantially disappeared in a similar filter fabricated with waveguiding elements electrically coupled to the reflector. In these experiments, the inband ripple increase was measured to be on the order of a few tenths of a dB.

TABLE I transducer parameters for a ladder filter,
where the subscripts R and T refer to reflector and
transducer, $\lambda$ and N refer to the periodicity and
number of elements, and gap lists the gap widths in
center frequency wavelengths.

| | $\lambda_R$ (microns) | $N_R$ | $\lambda_T$ (microns) | $N_T$ | Gap |
|---|---|---|---|---|---|
| Series | 4.421 | 101 | 4.313 | 101 | 0.64 |
| Shunt | 4.456 | 101 | 4.456 | 101 | 0.625 |

Applicants have also discovered that breadths 117, 117' . . . 117" of a plurality of waveguide elements such as 116, 116' . . . 116" desirably linearly taper from a first breadth for, e.g., waveguide element 116 adjacent reflector 112, to a second breadth for, e.g., waveguide element 116" adjacent transducer 115. Typically, all of reflector elements 113 have a first uniform breadth distinct from a second uniform breadth typical of transducer electrodes 122. In one embodiment, the taper might be effected such that a first waveguiding element (e.g., 116) has a breadth 117 equal to the first uniform breadth plus a first amount equal to: a difference between the first and second uniform breadths, divided by a number of waveguiding elements included in the first plurality. A second waveguiding element, e.g., 116', has a breadth 117' equal to the first uniform breadth plus a second amount equal to: a difference between the first and second uniform breadths, multiplied by two and divided by a number of waveguiding elements included in the first plurality. Similarly, the final waveguiding element 116" of the plurality would have a breadth equal to the second uniform breadth minus a first amount equal to: a difference between the first and second uniform breadths, divided by a number of waveguiding elements included in the first plurality.

Other taperings of breadths of waveguiding elements 116, 116' . . . 116" are also possible, for example, exponential, hyperbolic and the like, however, for most applications, ten or fewer waveguide elements are included in a plurality of waveguiding elements such as 116, 116' . . . 116". Many applications require five or fewer waveguiding elements 116, 116' . . . 116" and in a number of situations only one, two or three waveguiding elements are needed in each plurality of waveguiding elements 116, 116' . . . 116" and 141, 141' . . . 141".

Typically, the designer of such a filter chooses gap widths for gaps disposed between the transducers and the reflectors to provide an approximation to a combination of passband insertion loss, out-of-band rejection characteristics and bandwidth and then adjusts the widths of gap(s) disposed between transducers 115, 134 and any grating 126 disposed between transducers 115, 134 to realize optimum bandwidth, insertion loss and other filter characteristics.

In another embodiment of the present invention, several such filters 110 may be cascaded to provide further performance enhancement. A first filter 110 has an electrical input (e.g., terminals 120, 120') and an output (e.g., terminals 136, 136'). A second filter 110 has an electrical input (e.g., terminals 120, 120') coupled to the electrical output of the first filter (i.e., terminals 136, 136') and the second filter then provides an output signal at the output terminals of the second filter (e.g., terminals 136, 136'). This configuration provides improved out-of-band signal rejection together with increased passband insertion loss. When the first and second filters are chosen to have slightly different parameters, nulls in the out-of-band characteristics of one filter may be placed at frequencies different from those of the nulls of the out-of-band characteristic of the other to provide improved out-of-band signal rejection.

Figure 2:
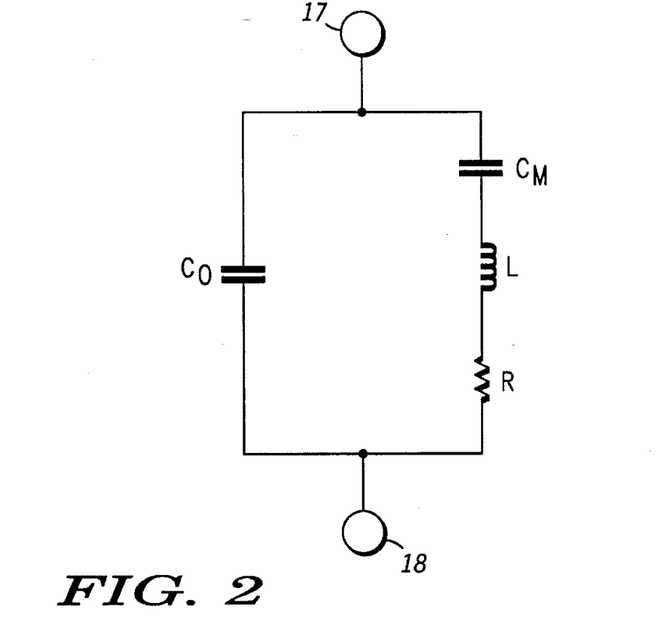
FIG. 2 is a schematic diagram of a simplified equivalent circuit for the resonator of FIG. 1.

FIG. 2 is a schematic diagram of a simplified equivalent circuit for resonator 110 of FIG. 1. Values for components $C_o$, $C_m$, L, R shown in FIG. 2 are found from Eqs. 1–3, the geometry of transducer 115 and relevant material constants. R may be usefully estimated as zero (i.e., ignored) or may be modeled from empirical data. Values of a few Ohms are often encountered in practice. R represents bulk wave radiation, acoustic propagation away from the receiving transducer, metal resistivity, diffraction effects and other losses encountered in resonant elements. Static capacitance $C_o$ is found from:

$$C_o = C_e NW, \qquad (1)$$

where $C_e$ is a material parameter describing capacitance per finger pair per cm (tabulated for many materials in a variety of textbooks), N represents the number of transducer finger pairs (e.g., pairs of electrodes 122 in transducer 115, FIG. 1) and W represents the overlap of electrodes 122 in cm (transverse to directions 8, 9).

Motional capacitance $C_m$ is related to static capacitance $C_o$:

$$C_m = (8k^2 C_o)/(\pi^2), \qquad (2)$$

where $k^2$ represents the electromechanical coupling coefficient (tabulated in a variety of textbooks related to piezoelectric materials). Motional inductance L is given by:

$$L = 1/(C_m \omega_r^2), \qquad (3)$$

where $\omega_r$ represents the radian transducer resonant frequency.

Admittance Y measured between terminals 20, 20' of FIG. 2 (corresponding, e.g., to terminals 120, 120' of FIG. 1) is:

$$Y = j\omega C_o + 1/(R + j(\omega L - 1/(\omega C_m))). \qquad (4)$$

Admittance Y has resonant frequency $\omega_r$, usually close to and slightly lower than the acoustic center frequency (approximately the sound velocity divided by the acoustic wavelength associated with the periodicity of electrodes 122 of transducer 115):

$$\omega_r = (LC_m)^{-0.5}, \qquad (5)$$

and antiresonant frequency $\omega_a$:

$$\omega_a = \omega_r (1 + C_m/C_o)^{0.5}, \qquad (6)$$

or $$\omega_a = \omega_r (1 + 8k^2/\pi^2)^{0.5}. \qquad (7)$$

Antiresonant frequency $\omega_a$ is always greater than resonant frequency $\omega_r$ by a ratio determined by electromechanical coupling coefficient $k^2$ (Eq. 7). For extremely high coupling coefficients (e.g., $k^2 > 5\%$), an appropriate coupling coefficient value may need to be empirically determined because the assumptions employed in relating physical parameters (e.g., acoustic wavelength, radiation conductance, $\omega_a$, $\omega_r$, etc.) to each other and to acoustic center frequencies are not entirely valid. In accordance with the present invention, coupling coefficients are generally usefully greater than 0.0001, more usefully greater than 0.01, generally desirably greater than 0.05, more desirably greater than 0.07 and preferably greater than 0.10.

Figure 3:
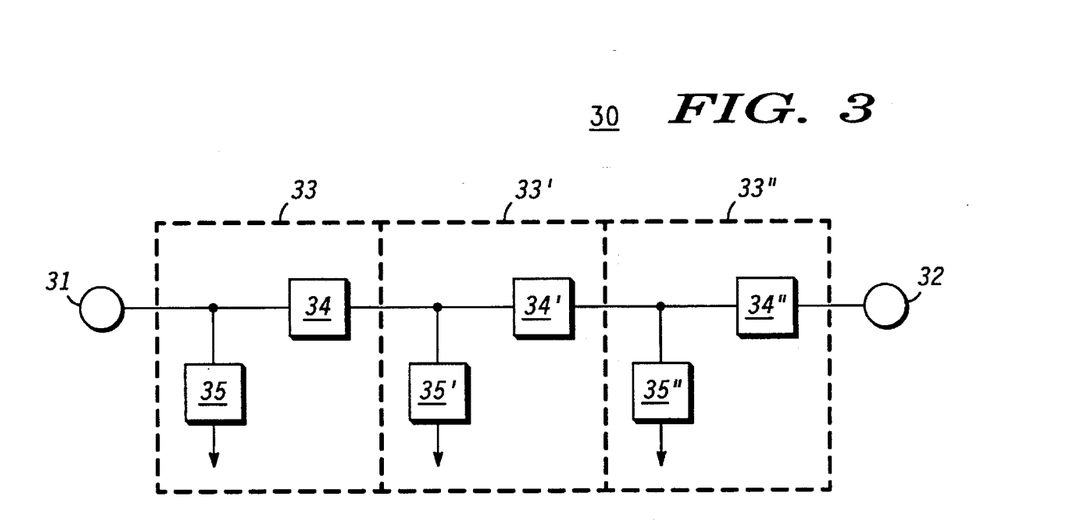
FIG. 3 is a simplified plan view of a three section ladder filter in accordance with the present invention.

FIG. 3 is a simplified plan view of three section ladder filter 30 having first and second ports 31, 32 in accordance with the present invention. Ladder filter 30 is typically specified to have a passband bandwidth about a center frequency $f_o$. Three section ladder filter 30 comprises first section 33 having series element 34 and shunt element 35, second section 33' having series element 34' and shunt element 35' and third section 33" having series element 34" and shunt element 35". In one embodiment, series elements 34, 34" may be chosen to be nominally identical and similarly shunt elements 35, 35". A fourth series element (not illustrated) may optionally be coupled between series element 34" and port 32, with shunt element 35" coupled to series element 34" as shown.

Second section 33' may be chosen to have narrower bandwidth and correspondingly an inductive impedance characteristic over at least a portion of the filter passband in accordance with the present invention. In this scenario, first section 33 and/or third section 33" may be chosen to have broader bandwidth and correspondingly capacitive impedance characteristic over the same filter passband portion such that the inductive characteristic of second section 33' essentially cancels capacitive contributions from the combination of first 33 and third 33" sections.

Alternatively, second section 33' may be chosen to represent a broader bandwidth and a capacitive impedance characteristic over a portion of the filter passband. The combination of first 33 and third 33" sections then provides a narrower passband and an inductive impedance over a portion of the filter passband, with the capacitive impedance component of second section 33' essentially canceling the inductive contributions from the combination of first 33 and third 33" sections over at least part of the filter passband.

On the other hand, first 33 and second 33' sections may provide a combined reactance essentially canceling the reactive impedance component of third section 33" or first section 33 may provide a reactance essentially canceling the reactive impedance component provided by the combination of second 33' and third 33" sections.

In general, the combined reactive impedances of any group of sections may be contributed in essentially equal parts from each section, may depend more heavily on one section or group of sections than another or may be essentially derived from only a subset of sections or a single section. Further, when a complex load or source impedance is desired or required, the combined impedances may be chosen to provide a complex conjugate match thereto.

Prior art ladder filters typically employ elements wherein the resonant frequency of the series elements are chosen to be equal to the antiresonant frequencies of the shunt elements. In traditional narrow-band crystal lattice filters employing quartz resonant elements, electromechanical coupling coefficient $k^2$ is typically much smaller than 0.5%, limiting the fractional bandwidth (bandwidth divided by center frequency) achievable for such filters to very small values.

Applicants have discovered that use of much higher coupling coefficient materials (e.g., $LiNbO_3$, $LiTaO_3$ etc.) provide much greater spread between resonant and antiresonant frequencies. For example, 64° $LiNbO_3$ provides a coupling coefficient in the range of from 9% to 13% (nominally about 10.5%), 41° $LiNbO_3$ provides coupling coefficients in the range from 15–25% (nominally about 17%) and 36° $LiTaO_3$ provides coupling coefficients in the range from 6.5–8% (nominally about 7.5%). This increased frequency spread in turn allows greater design freedom.

Applicants have discovered that choosing resonant frequency $\omega_r$ of the series resonant element to be less than antiresonant frequency $\omega_a$ of the shunt resonant element provides an L section having narrower bandwidth than the conventional approach (resonant frequency $\omega_r$ of the series resonant element equal to antiresonant frequency $\omega_a$ of the shunt element) and also having a positive imaginary impedance component (i.e., inductive reactance) at the desired filter center frequency $f_o$. Similarly, choosing resonant frequency $\omega_r$ of the series resonant element to be greater than antiresonant frequency $\omega_a$ of the shunt resonant element provides a section having greater bandwidth than the conventional approach and also having a negative imaginary impedance component (i.e., capacitive reactance) at the desired filter center frequency $f_o$. Combining a filter section having a negative impedance component with a filter section having a positive impedance component allows complex conjugate impedance matching between sections, providing reduced insertion loss at and near the filter center frequency $f_o$ and greater flexibility in filter bandwidth selection.

EXAMPLE

Figure 4:
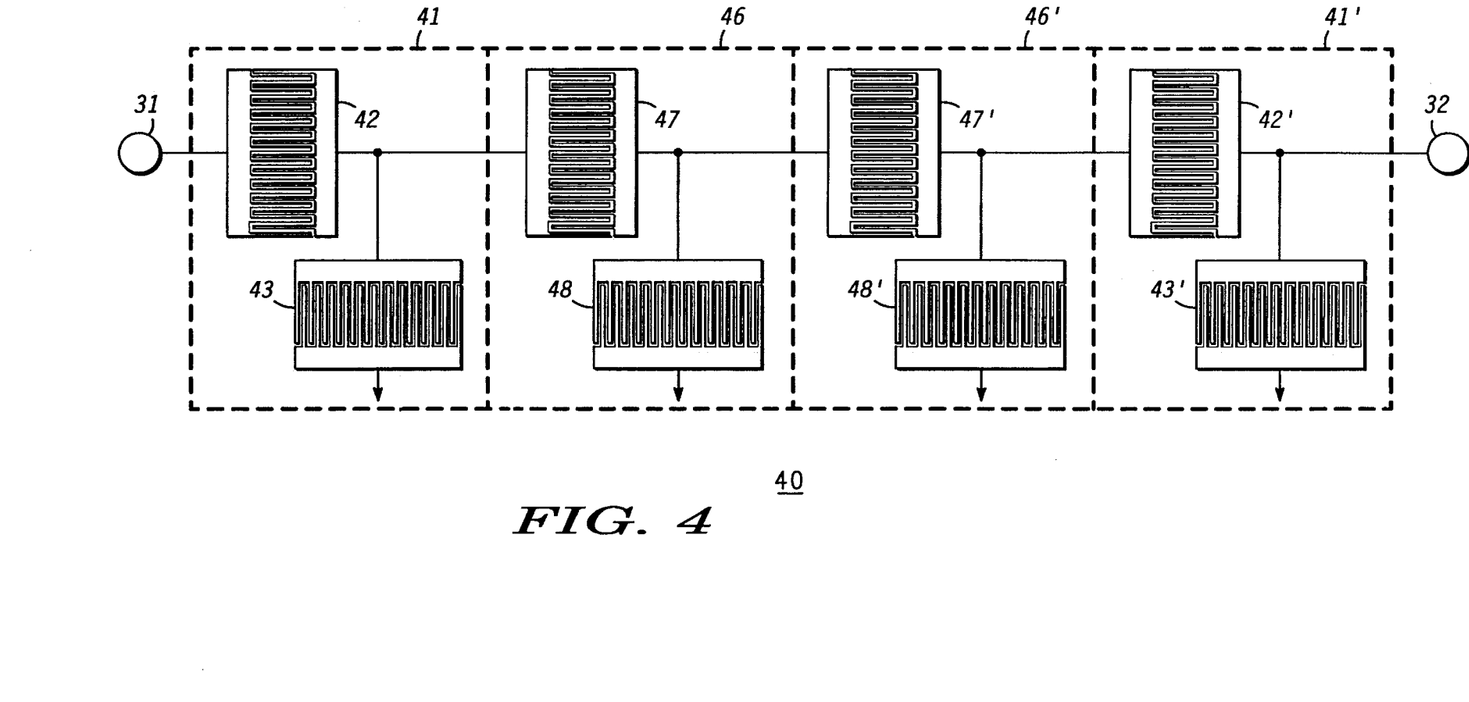
FIG. 4 is a simplified plan view of a four section ladder filter.

FIG. 4 is a simplified plan view of four section ladder filter 40 having first and second electrical ports 31, 32. Transducers comprising series elements 42, 42', 47, 47' and shunt elements 43, 43', 48, 48' typically have principal directions of acoustic wave propagation (analogous to directions 8, 9 of FIG. 1) aligned to a common preferred axis, i.e. parallel to one another. In this example, end sections 41, 41' are chosen to comprise identical elements and similarly middle sections 46, 46'. End sections 41, 41' comprise series elements 42, 42' and shunt elements 43, 43' having 925.8 MHz and 899.7 MHz resonant frequencies $\omega_r$, respectively, while middle sections 46, 46' comprise series elements 47, 47' and shunt elements 48, 48' having 944.2 MHz and 882.6 MHz resonant frequencies $\omega_r$, respectively.

Applicants have discovered that choosing the resonant frequency of series resonant element 42 to be near the antiresonant frequency of shunt element 48 and the resonant frequency of series element 47 to be near the antiresonant frequency of shunt element 43 provides a passband characteristic and complex conjugate matching of section 41 (at the filter center frequency, $Z_{in}$ ca. 50+j20 Ω at one side of section 41 when the other side is terminated in 50 Ω) to section 46. This provides the filter performance tabulated for design #1 in Table II. Alternatively, section 41 could be chosen to have a capacitive impedance at the filter center frequency and section 46 to have the conjugate impedance.

All of the filters summarized in Table II employ 7, 8, or 9 resonators (# Res.), show very good insertion loss (IL), and achieve relatively large 4.5 dB and 20 dB bandwidths (BW). Comparison of designs 1, 4, 5 and similarly designs 2, 3 shows that ultimate rejection (Ult. Att.) for ladder filters is determined in part by the capacitance ratio (Cap. rat., the ratio of the series $C_o$ to the shunt $C_o$). At frequencies well removed from filter center frequency $f_o$, the series and shunt elements act as a capacitive voltage divider to determine the ultimate (out-of-band) attenuation (Ult. Att.) or rejection. Comparison of designs 1, 2 and also 5, 6 shows, ceteris paribus, that as the number of L-sections increases, the ultimate rejection also increases.

TABLE 2

Measured ladder filter performance for several different ladder filter designs fabricated using surface wave resonators comprising 301 electrodes with an acoustic beamwidth of 43.9 micrometers on 640 Y-rotated $LiNbO_3$.

| Des # | # Res. | IL (dB) | 4.5 dB BW (%) | 20 dB BW (%) | Ult. Att. | Cap. rat. | Ser. Co (pF) |
|---|---|---|---|---|---|---|---|
| 1 | 8 | 1.2 | 4.9 | 7.5 | 30 | 1.0 | 3.5 |
| 2 | 7 | 1.3 | 5.4 | 7.6 | 25 | 1.0 | 3.5 |
| 3 | 7 | 0.4 | 5.7 | 7.4 | 20 | 0.7 | 4.5 |
| 4 | 8 | 0.5 | 5.4 | 7.3 | 24 | 0.7 | 4.4 |
| 5 | 8 | 0.3 | 5.7 | 7.3 | 20 | 0.5 | 5.2 |
| 6 | 9 | 0.4 | 5.7 | 7.3 | 23 | 0.5 | 5.4 |
| 7 | 8 | 0.4 | 5.4 | 7.3 | 25 | 0.7 | 4.7 |
| 8 | 8 | 0.4 | 5.3 | 7.2 | 24 | 0.7 | 4.2 |

In accordance with the present invention, series and shunt elements' resonant $\omega_r$ and antiresonant $\omega_a$ frequencies are usefully determined by circuit optimization tools such as SuperCompact®, available from Compact Software of Paterson N.J. One method is to input a series of resonant $\omega_r$ and/or antiresonant $\omega_a$ frequencies in accordance with Eq. 7, with the shunt elements' antiresonant frequencies $\omega_a$ approximately equal to the series elements' resonant frequencies $\omega_r$ and to then enable the circuit optimization tools to determine a modified set of resonant $\omega_r$ and antiresonant $\omega_a$ frequencies. A modified example of a SuperCompact® input file is given below, corresponding to example #1 above and the response given in FIG. 5.

```
*series transducer variables
Con: ?2pF 3pF 6pF?
Cmn: 0.091*con
Fn: ?800 MHz 836.5 MHz 869 MHz?
*shunt transducer variables
Con: ?2pF 3pF 6pF?
Cmn: 0.091*con
Fn: ?800 MHz 836.5 MHz 869 MHz?
*Parasitics
Rpar: 1.7
Lbw: 1.5 nH
BLK
*nth transducer
CAP 1 4 C = Con
CAP 1 2 C = Cmn
IND 2 3 L = (12/(((2*PI*Fn)**2)*Cmn))
RES 3 4 R = Rpar
Sern: 2POR 14
BLK
* FILTER
IND 1 2 L = Lbw
Ser1 2 3
Ser2 3 4
Ser2 4 5
Ser1 5 6
Shunt1 3 8
Shunt2 4 9
Shunt2 5 10
Shunt1 6 11
IND 6 7 L = Lbw
IND 8 0 L = Lbw
IND 10 0 L = Lbw
IND 11 0 L = Lbw
Filter: 2POR 1 7
END
FREQ
STEP 711MHZ 962MHZ 1MHZ
END
*
OPT
Filter
F = 818MHZ 855MHZ
MS21 −1DB GT W = 20
MS11 −10DB LT
MS22 −10DB LT
F = 1MHZ 806MHZ
MS21 −30DB LT W = 5
F = 863MHZ 30000MHZ
MS21 −30DB LT W = 5
END
```

An input file corresponding to this example provides Co1=Co2=2.8798 pF, Co3=Co4=2.7524 pF, F1=831.94 MHz, F2=845.41 MHz, F3=806.1 MHz and F4=792.84 MHz when the gradient (quasi-Newton gradient method with least squares objective function formulation) and random optimizers are employed.

Ladder filters using surface acoustic wave resonators and especially resonators designed for relatively wide-band performance may be readily scaled in frequency by changing the pitch (periodicity) of the resonator transducer fingers (19, FIG. 1) while maintaining the ratios of the resonant frequencies $\omega_r$ obtained from circuit analysis tools or other methods. This allows a designer to re-use a similar design at a slightly different center frequency $f_o$ having similar specifications or permits a quick, two iteration convergence to a desired set of filter characteristics when the relationship between the resonant frequency $\omega_r$ and the transducer acoustic center frequency is not known a priori (e.g., on very high coupling coefficient materials where conventional approximations tend to provide poorer design guidance).

Figure 5:
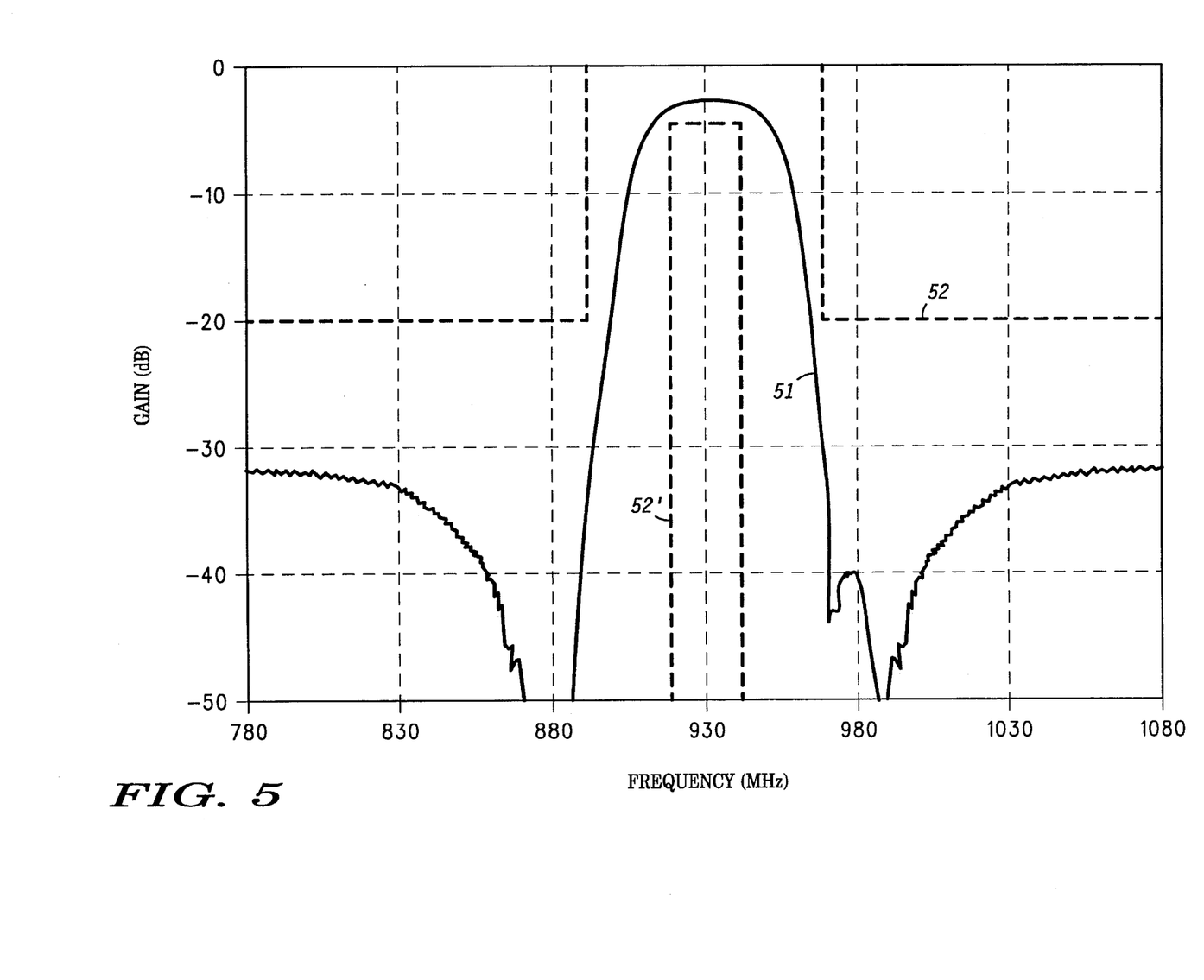
FIG. 5 is a measured frequency response and a specification for the ladder filter of FIG. 4.

FIG. 5 is a graph of measured frequency response 51 (solid trace) and specification 52, 52' (dashed traces) for ladder filter 40 of FIG. 4 built in accordance with the parameters given for design #1 of Table II, optimized in accordance with the SuperCompact example given above but over a different range of frequencies. The measured center frequency insertion loss of 2.5 dB falls between the specified insertion loss bounds of 0 dB and 4.5 dB, while the measured 4.5 dB bandwidth is 4.9% or 45.7 MHz, in agreement with the maximum and minimum bandwidths of 76.9 and 27.9 MHz. The out-of-band rejection exceeds 30 dB over the measured range (780 to 1080 MHz), in contrast to the minimum 20 dB required. The transducers employed 301 electrodes with an acoustic beamwidth of 43.9 micrometers on 64° Y-rotated $LiNbO_3$.

Measured characteristics 51 provide "room" for temperature-induced and other environmentally-induced changes in filter characteristics and also allow for manufacturing-induced device-to-device variations which may influence characteristics of as-built devices, providing a robust and manufacturable filter design.

Figure 6:
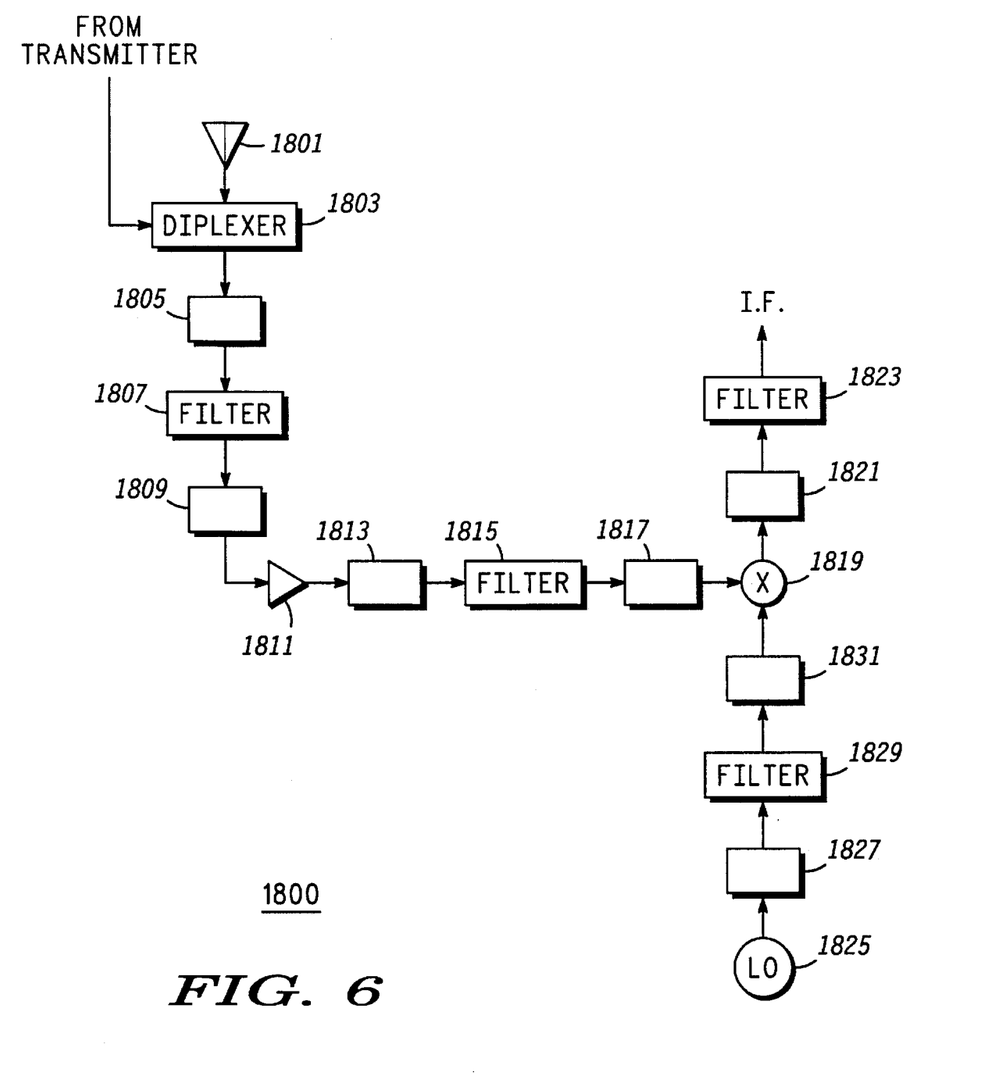
FIG. 6 is a block diagram of a portion of a radio frequency apparatus including ladder filters in accordance with the present invention.

FIG. 6 is a block diagram of portion 1800 of a radio frequency receiver or other radio frequency apparatus including ladder filters in accordance with the present invention. Apparatus 1800 includes antenna 1801, by way of example, used to receive and/or transmit signals. Alternatively, antenna 1801 could be replaced by a fiber-optic link or cable or other signal transmissive media.

Diplexer 1803 is coupled to antenna 1801 and to a transmitter portion (not shown). Diplexer 1803 is a special purpose filter which couples received signals (but not much larger signals from an attached transmitter) to filter 1807 via optional matching circuit 1805 according to the present invention. Filter 1807 is coupled to amplifier 1811 via optional matching element 1809 according to the present invention. The output of amplifier 1811 is transmitted to filter 1815 via optional matching element 1813 according to the present invention. Filter 1815 transmits its output to mixer 1819 via optional matching element 1817 according to the present invention. The signal from filter 1815 is combined in mixer 1819 with another signal from local oscillator 1825 coupled via filter 1829. Matching elements 1827, 1831 and 1821 are optionally provided with filters 1823, 1829. The output signal from mixer 1819 is then filtered by filter 1823 to provide the IF output signal. The arrangement of the present invention may be used to provide any or all of filters 1803, 1807, 1815, 1823, 1829. An oscillator and filter analogous to LO 1825, filter 1829 may be employed together with a suitable amplifier and modulator to provide the signal "FROM TRANSMITTER" and this filter (known as a "transmit clean-up filter") as well may be provided in accordance with the present invention. Thus, a ladder filter has been described which overcomes specific problems and accomplishes certain advantages relative to prior art methods and mechanisms. The improvements over known technology are significant. The expense, complexities, and high parts count of prior art cascaded filters are avoided. Further, real input and output impedances are realized for compact, lightweight, adjustment-free filters together with improved design flexibility.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of making an acoustic wave filter having reduced bulk-wave scattering loss, said method comprising steps of:

(a) providing an acoustic wave propagating substrate;

(b) disposing a first reflector on a first surface of said acoustic wave propagating substrate, said first reflector comprising a first group of periodically disposed reflective elements;

(c) disposing a first transducer to a first side of said first reflector, said first transducer comprising a first group of electrodes periodically disposed along a preferred axis on said first surface, said first transducer for providing acoustic waves traveling in either direction along said preferred axis in response to electrical stimulation and for providing electrical signals in response to acoustic waves incident on said first transducer, said first transducer having a first center frequency and an acoustic wavelength associated with said first center frequency, said first transducer separated from said first reflector by a first gap having a first width exceeding one-fourth of said acoustic wavelength;

(d) disposing a second reflector to a side of said first transducer opposite said first reflector, said second reflector comprising a second group of periodically disposed reflective elements, said second reflector separated from said first transducer by a second gap having a second width; and (e) disposing a first waveguiding element having a first breadth within said first gap, said first width exceeding said first breadth, said first waveguiding element being aperiodic with said first group of electrodes and said first group of periodically disposed reflective elements.

2. A method as claimed in claim 1, further comprising steps of:

(f) disposing a second transducer between said first transducer and said second reflector, said second transducer comprising a second group of electrodes periodically disposed along said preferred axis on said first surface; and (g) disposing a grating between said first and second transducers, said grating comprising a series of periodically disposed electrodes, said grating separated from said first transducer by said second gap, said grating separated from said second transducer by a third gap having a third width, wherein said second transducer is separated from said second reflector by a fourth gap having a fourth width.

3. A method as claimed in claim 2, wherein said step (g) comprises a step of disposing a grating between said first and second transducers, wherein said first, second, third and fourth widths exceed one-half of said acoustic wavelength.

4. A method as claimed in claim 2, wherein said step (e) comprises a step of disposing a first waveguiding element having a first breadth in a range of from one-tenth to two-tenths of said acoustic wavelength.

5. A method as claimed in claim 3, further comprising steps of:
 (h) disposing a second waveguiding element in said second gap, said second waveguiding element having a second breadth, said second width exceeding said second breadth;
 (i) disposing a third waveguiding element in said third gap, said third waveguiding element having a third breadth, said third width exceeding said third breadth; and
 (j) disposing a fourth waveguiding element in said fourth gap, said fourth waveguiding element having a fourth breadth, said fourth width exceeding said fourth breadth.

6. An acoustic wave filter with reduced bulk-wave scattering loss, said acoustic wave filter having a center frequency and an acoustic wavelength associated with said center frequency, said acoustic wave filter comprising:
 an acoustic wave propagating substrate;
 a first reflector comprising a first group of reflective elements each having a first breadth, said first group of reflective elements periodically disposed along a preferred axis on a first surface of said acoustic wave propagating substrate and having a first period;
 a first transducer disposed to a first side of said first reflector, said first transducer comprising a first group of electrodes each having a second breadth, said first group of electrodes periodically disposed along said preferred axis on said first surface and having a second period, said first transducer for providing acoustic waves traveling in either direction along said preferred axis in response to electrical stimulation, thereby insonifying an acoustic path via propagation of said acoustic waves, and for providing electrical signals in response to acoustic waves incident on said first transducer;
 a first gap having a first width, said first width exceeding one-fourth of said acoustic wavelength, said first gap disposed between said first reflector and said first transducer on said first surface;
 a second reflector comprising a second group of reflective elements each having said first breadth and periodically disposed along said preferred axis on said first surface, said second reflector disposed to a side of said first transducer opposite said first reflector;
 a second gap disposed on said first surface between said first transducer and said second reflector, said second gap having a second width; and
 a first plurality of waveguiding elements aperiodically disposed within said first gap.

7. An acoustic wave filter as claimed in claim 6, wherein said first plurality of waveguiding elements comprises a group of ten or fewer waveguiding elements.

8. An acoustic wave filter as claimed in claim 6, wherein said first plurality of waveguiding elements comprises a group of waveguiding elements including a first waveguiding element adjacent said first reflector, said first waveguiding element having a third breadth equal to said first breadth plus: a first amount equal to a difference between said first and second breadths, divided by a number of waveguiding elements included in said first plurality of waveguiding elements.

9. An acoustic wave filter as claimed in claim 8, wherein said first plurality of waveguiding elements comprises a group of waveguiding elements including a second waveguiding element adjacent said first waveguiding element, said second waveguiding element having a fourth breadth equal to said first breadth plus: a second amount equal to twice said difference between said first and second breadths, divided by said number of waveguiding elements included in said first plurality of waveguiding elements.

10. An acoustic wave filter as claimed in claim 6, wherein said first plurality of waveguiding elements comprises a group of electrically floating waveguiding elements disposed to linearly taper from said first breadth to said second breadth.

11. An acoustic wave filter as claimed in claim 6, further comprising a second plurality of waveguiding elements aperiodically disposed in said second gap.

12. An acoustic wave filter as claimed in claim 11, wherein said second plurality of waveguiding elements comprises a group of waveguiding elements disposed to linearly taper from said first breadth adjacent said second reflector to said second breadth.

13. An acoustic wave filter as claimed in claim 6, further comprising:
 a second transducer disposed between said first transducer and said second reflector such that said second gap is disposed between said second transducer and said second reflector; and
 a second plurality of waveguiding elements aperiodically disposed in said second gap.

14. An acoustic wave filter as claimed in claim 13, further comprising a grating disposed between said first and second transducers, said grating comprising a series of periodically disposed electrodes, said grating separated from said first transducer by a third gap, said grating separated from said second transducer by a fourth gap.

15. An acoustic wave filter as claimed in claim 13, wherein said second plurality of waveguiding elements comprises a group of waveguiding elements disposed to linearly taper from said first breadth adjacent said second reflector to said second breadth.

16. An acoustic wave filter as claimed in claim 13, wherein said second plurality of waveguiding elements includes a first waveguiding element adjacent said second reflector, said first waveguiding element having a third breadth equal to said first breadth plus: a first amount equal to a difference between said first and second breadths, divided by a number of waveguiding elements included in said first plurality of waveguiding elements.

17. An acoustic wave filter as claimed in claim 16, wherein said second plurality of waveguiding elements comprises a group of waveguiding elements including a second waveguiding element adjacent said first waveguiding element, said second waveguiding element having a fourth breadth equal to said first breadth plus: a second amount equal to twice said difference between said first and second breadths, divided by said number of waveguiding elements included in said first plurality of waveguiding elements.

18. An acoustic wave filter with reduced bulk-wave scattering loss, said acoustic wave filter having a center frequency and an acoustic wavelength associated with said center frequency, said acoustic wave filter comprising:
 an acoustic wave propagating substrate;
 a first reflector comprising a first group of reflective elements each having a first breadth, said first group of reflective elements periodically disposed along a preferred axis on a first surface of said acoustic wave propagating substrate and having a first period;
 a first transducer disposed to a first side of said first reflector, said first transducer comprising a first group of electrodes each having a second breadth, said first group of electrodes periodically disposed along said preferred axis on said first surface and having a second period, said first transducer for providing acoustic waves traveling in either direction along said preferred axis in response to electrical stimulation, thereby insonifying an acoustic path via propagation of said acoustic waves, and for providing electrical signals in response to acoustic waves incident on said first transducer;

a first gap having a first width, said first width exceeding one-fourth of said acoustic wavelength, said first gap disposed between said first reflector and said first transducer on said first surface;

a second reflector comprising a second group of reflective elements each having said first breadth and periodically disposed along said preferred axis on said first surface, said second reflector disposed to a side of said first transducer opposite said first reflector;

a second gap disposed on said first surface between said first transducer and said second reflector, said second gap having a second width;

a first plurality of waveguiding elements aperiodically disposed within said first gap including a first waveguiding element adjacent said first reflector, said first waveguiding element having a third breadth equal to said first breadth plus: a first amount equal to a difference between said first and second breadths, divided by a number of waveguiding elements included in said first plurality of waveguiding elements;

a second transducer disposed between said first transducer and said second reflector such that said second gap is disposed between said second transducer and said second reflector; and a second plurality of waveguiding elements aperiodically disposed in said second gap.

19. An acoustic wave filter as claimed in claim 18, further comprising a grating disposed between said first and second transducers, said grating comprising a series of periodically disposed electrodes, said grating separated from said first transducer by a third gap, said grating separated from said second transducer by a fourth gap.

* * * * *